(12) United States Patent
Murakami et al.

(10) Patent No.: US 7,919,908 B2
(45) Date of Patent: Apr. 5, 2011

(54) PIEZOELECTRIC RESONATOR DEVICE

(75) Inventors: Tatsuya Murakami, Kakogawa (JP); Masashi Hirai, Kakogawa (JP); Makoto Miyagawa, Kakogawa (JP); Akihiro Kanbara, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 485 days.

(21) Appl. No.: 11/992,948

(22) PCT Filed: May 25, 2007

(86) PCT No.: PCT/JP2007/060713
§ 371 (c)(1),
(2), (4) Date: Apr. 2, 2008

(87) PCT Pub. No.: WO2008/018222
PCT Pub. Date: Feb. 14, 2008

(65) Prior Publication Data
US 2009/0224634 A1 Sep. 10, 2009

(30) Foreign Application Priority Data
Aug. 10, 2006 (JP) .................................. 2006-218118

(51) Int. Cl.
*H01L 41/053* (2006.01)
(52) U.S. Cl. ........................ 310/344; 310/340
(58) Field of Classification Search .................. 310/340, 310/344, 366
See application file for complete search history.

(56) References Cited

U.S. PATENT DOCUMENTS

| 7,138,751 B2* | 11/2006 | Sunaba et al. | 310/344 |
| 7,557,491 B2* | 7/2009 | Kigawa et al. | 310/344 |
| 7,579,748 B2* | 8/2009 | Kuroda | 310/312 |

FOREIGN PATENT DOCUMENTS

| JP | 2000-150574 | | 5/2000 |
| JP | 2000-236035 | | 8/2000 |
| JP | 2002-313838 | | 10/2002 |
| JP | 2004-064217 | | 2/2004 |
| JP | 2005-123297 | | 5/2005 |
| JP | 2005-136812 | * | 5/2005 |
| JP | 2005-243873 | * | 9/2005 |
| JP | 2005-268390 | * | 9/2005 |
| JP | 2005-347419 | * | 12/2005 |

OTHER PUBLICATIONS

International Search Report mailed Jul. 24, 2007 for International Application No. PCT/JP2007/060713.
Comments on Written Opinion of the International Bureau Based on References Cited in the International Search Report mailed Jul. 24, 2007 for International Application No. PC/TJP2007/060713.

* cited by examiner

*Primary Examiner* — Thomas M Dougherty
(74) *Attorney, Agent, or Firm* — Marvin A. Motsenbocker; Mots Law, PLLC

(57) ABSTRACT

A piezoelectric resonator device includes a base holding a piezoelectric resonator element and a lid bonded to the base in order to hermetically seal the piezoelectric resonator element held on the base. In addition, the region of bonding of the base to the lid is composed of at least a nickel-cobalt layer comprising nickel and cobalt, and a metal layer laminated on the nickel-cobalt layer, with the base and lid bonded by heat-melting using a metallic braze material.

20 Claims, 5 Drawing Sheets

Fig.3

| Ni:Co=3:1 | Number of resonators | Good | NG | Yield |
|---|---|---|---|---|
| LOT 1 | 136 | 134 | 2 | 98.5% |
| LOT 2 | 140 | 139 | 1 | 99.3% |
| LOT 3 | 153 | 153 | 0 | 100.0% |
| LOT 4 | 175 | 175 | 0 | 100.0% |
| LOT 5 | 173 | 173 | 0 | 100.0% |
| LOT 6 | 172 | 171 | 1 | 99.4% |
| LOT 7 | 163 | 162 | 1 | 99.4% |
| LOT 8 | 178 | 178 | 0 | 100.0% |
| TOTAL | 1290 | 1285 | 5 | 99.6% |
| Ni:Co=6:1 | Number of resonators | Good | NG | Yield |
| LOT 10 | 161 | 84 | 77 | 52.2% |
| LOT 11 | 164 | 78 | 86 | 47.6% |
| LOT 12 | 161 | 83 | 78 | 51.6% |
| LOT 13 | 171 | 105 | 66 | 61.4% |
| TOTAL | 657 | 350 | 307 | 53.3% |

Eutectic constituent part
92
93
5.5 μm

PIEZOELECTRIC RESONATOR DEVICE

TECHNICAL FIELD

The present invention relates to a piezoelectric resonator device.

BACKGROUND ART

Crystal resonators, crystal filters, crystal oscillators, and other piezoelectric resonator devices are examples of electronic components requiring hermetic sealing. In all of these products, excitation electrodes are formed on the major surfaces of a crystal resonator element and these excitation electrodes are hermetically sealed by the main body casing of the piezoelectric resonator device in order to protect the excitation electrodes from ambient atmosphere.

In piezoelectric resonator devices, the main body casing is made up of a base and a lid. Such piezoelectric resonator devices include devices, in which the base and lid are directly seam-bonded using a metal ring for seam welding, thereby forming the interior space of the main body casing and simultaneously hermetically sealing the interior space, with a piezoelectric resonator element held inside said interior space (for example, see Patent Document 1).

The main body casing of the piezoelectric resonator device disclosed in Patent Document 1 comprises a ceramic package (referred to as "base" in this Detailed Description) of a concave cross-section containing a crystal resonator element (referred to as "piezoelectric resonator element" in this Detailed Description), and a metal lid bonded to the opening portion of this base (referred to as "lid" in this Detailed Description). The main body casing, which hermetically seals the crystal resonator element, is formed by bonding a metal ring for seam welding with the help of a silver braze material to create a joint portion on the base and then bonding the lid to the base over the metal ring using seam welding (a type of resistance welding).

Moreover, there is a method (e.g. see Patent Document 2) based on a technology that is different from Patent Document 1, in which a metal ring is not used and, instead, upon forming a metal film (e.g. a multi-layer configuration of tungsten-nickel-gold) on a base and forming, for instance, silver solder (copper-silver alloy) on a lid, the metal film portion of the base and the silver solder of the lid are bonded together using a seam welding technique. Because this method utilizes a metal film instead of using a metal ring in order to accomplish direct seam welding (bonding), Patent Document 2 allows for low height geometry to be achieved for the main body casing (base).

Patent Document 1: JP2004-64217A.
Patent Document 2: JP2000-236035A.

DISCLOSURE OF INVENTION

Problem to be Solved by the Invention

Incidentally, the problem with direct seam welding is that, due to its stringent welding conditions, the stress/strain generated during seam welding causes damage to the base if the conditions are somewhat less than optimal.

Specifically, in Patent Document 2, due to the use of direct seam bonding, i.e. continuous local bonding, for the bonding of the base and lid, local pressure is applied to the bonding area of the base during the bonding of the base and lid, which occasionally generates cracks in the base and causes other damage to the base. Such damage tends to occur more readily as the dimensions of the bonding location on the base become smaller as a result of miniaturization of electronic components.

Moreover, in case of direct seam welding, it is necessary to bring the members (a pair of seam rollers used directly for welding) of the seam welding apparatus into direct contact with the location where the direct seam bonding of the lid is carried out. For this reason, as the miniaturization of modern piezoelectric resonator devices advances, the members (seam rollers) of the seam welding apparatus used for direct seam welding start interfering (shorting) with each other or coming into contact with areas outside of the desired region, which is the reason why efficient seam welding is made impossible and, as a result, efficient fabrication is impeded.

Accordingly, in order to eliminate the above-described problems, it is an object of the present invention to provide a piezoelectric resonator device which, along with preventing damage to. the main body casing of the piezoelectric resonator device during fabrication of the piezoelectric resonator device, permits adaptation to miniaturization of the main body casing.

Means for Solving Problem

In order to attain the above-described object, in the piezoelectric resonator device according to the present invention, which is a piezoelectric resonator device provided with a base holding a piezoelectric resonator element and a lid bonded to the base in order to hermetically seal the piezoelectric resonator element held on the base, the region of bonding of the base to the lid is composed of at least a nickel-gold layer made up of nickel and gold and a metal layer made up of metallic material laminated on the nickel-gold layer, with the base and lid bonded by heat-melting using a metallic braze material.

According to the present invention, the region of bonding of the base to the lid is composed of at least a nickel-cobalt layer and a metal layer and the base and lid are bonded by heat-melting using a metallic braze material (for example, gold-tin, tin-silver-copper, bismuth-silver, etc.), which prevents damage to the main body casing of the piezoelectric resonator device during fabrication of said piezoelectric resonator device while permitting adaptation to miniaturization of the main body casing. In other words, the failures that occur due to the use of direct seam bonding, i.e. continuous local bonding, for the bonding of the base to the lid do not occur in the present invention because of its use of heat/melt bonding for the bonding of the base to the lid. Specifically, unlike in direct seam bonding, the bonding of the base to the lid in the present invention consists in simultaneous full-surface bonding, and, as a result, application of local pressure to the bonding area of the base during the bonding of the base to the lid can be avoided. Moreover, in case of the heat/melt bonding, the members of the apparatus never come into contact with the base or lid during the bonding of the base to the lid, which makes it possible to avoid the adverse effects of the contact on the miniaturization of the main body casing. Moreover, since a nickel-cobalt layer is included in the configuration in the present invention, the nickel of the nickel-cobalt layer undergoes diffusion during the bonding of the base to the lid using heat/melt bonding, but the diffusion of the nickel can be minimized by the cobalt. Thus, according to the present invention, nickel diffusion into the metal layer can be properly minimized, which makes it possible to improve the bonding of the base to the lid without decreasing the wettability of the metallic braze material.

In the above-described configuration, the heat/melt bonding may be carried out by heating to a temperature of not more than 360° C.

Because in this case the heating temperature does not exceed 360° C., nickel diffusion in the nickel-cobalt layer can be minimized. Specifically, when the heating temperature is 500° C., the nickel of the nickel-cobalt layer diffuses all the way to the surface of the metal layer, thereby adversely affecting the bonding of the base and lid. The "adverse effects", as referred to herein, are the reason why hermeticity failures in the main body casing occur; specifically, the nickel forms compounds with the tin of the metallic braze material on the surface of the base and the composition of the metallic braze material undergoes changes due to their formation, as a result of which the wettability of the metallic braze material decreases and hermeticity failures occur in the main body casing. Incidentally, when the heating temperature is 400° C., the wettability of the metallic braze material deteriorates. Specifically, when the heating temperature is as high as 400° C., nickel diffusion in the nickel-cobalt layer is enhanced and it is revealed on the bonding surface, causing the wettability (flowability) of the metallic braze material on the bonding surface (the bonding region on the surface of the base) to deteriorate. As a result, hermeticity failures occur in the main body casing.

In this configuration, the ratio of nickel to cobalt in the nickel-cobalt layer may be between 1:1 and 3:1.

Because in this case the ratio of nickel to cobalt in the nickel-cobalt layer is between 1:1 and 3:1, the wettability of the metallic braze material improves and, as a result, hermeticity failures in the main body casing are prevented.

In the above-mentioned configuration, the thickness of the metal layer may be 0.3 to 1.0 μm.

Because the thickness of the metal layer in such a case is between 0.3 and 1.0 μm, the appearance of the nickel diffused in the nickel-cobalt layer on the surface of the metal layer and its adverse effects on the bonding of the base to the lid can be minimized while making it possible to achieve miniaturization of the main body casing. The "adverse effects", as referred to herein, are the reason why hermeticity failures in the main body casing occur; specifically, the nickel forms compounds with the tin of the metallic braze material on the surface of the base and the composition of the metallic braze material undergoes changes due to their formation, as a result of which the wettability of the metallic braze material decreases and hermeticity failures occur in the main body casing.

In the above-mentioned configuration, the metallic braze material may be composed of a non-eutectic constituent part and a first intermetallic compound.

Because in this case the metallic braze material is composed of the non-eutectic constituent part and the first intermetallic compound, temperature conditions during rework can be satisfied by changing the melting temperature. Specifically, while there is a chance that the metallic braze material might melt down again and create an impediment to rework when rework is carried out at the temperature of heat-melting or a temperature close thereto if the metallic braze material bonding the lid to the base has a eutectic composition, the present invention makes it possible to prevent the melting point of the metallic braze material from rising and causing re-melting.

In the above-mentioned configuration, the non-eutectic constituent part may comprise, in a non-eutectic state, a second intermetallic compound composed of gold and tin, in which the compositional ratio of gold is higher, and a third intermetallic compound composed of gold and tin, in which the gold and tin are present in the composition in roughly the same compositional ratios.

Because in such a case the non-eutectic constituent part comprises the second intermetallic compound and the third intermetallic compound in a non-eutectic state, the melting temperature of the metallic braze material shifts towards gold, and it becomes possible to raise the melting temperature of the metallic braze material comprising the gold-tin alloys.

In the above-mentioned configuration, the metallic braze material and the bonding region may be composed of at least a non-eutectic constituent part, a first intermetallic compound, and a nickel-cobalt layer comprising nickel and cobalt.

Because in this case the metallic braze material and the bonding region are composed of at least the non-eutectic constituent part, the first intermetallic compound, and the nickel-cobalt layer, temperature conditions during rework can be satisfied by changing the melting temperature. Specifically, while there is a chance that the metallic braze material might melt down again and create an impediment to rework when rework is carried out at the temperature of heat-melting or a temperature close thereto if the metallic braze material bonding the lid to the base has a eutectic composition, the present invention makes it possible to prevent the metallic braze material from re-melting.

In the above-mentioned configuration, the non-eutectic constituent part comprises, in a non-eutectic state, a second intermetallic compound composed of gold and tin, in which the compositional ratio of gold is higher, and a third intermetallic compound containing a compound composed of gold and tin, in which the gold and tin are roughly equal, and the first intermetallic compound may be composed of nickel and tin.

Because in this case the non-eutectic constituent part comprises the second intermetallic compound and the third intermetallic compound in a non-eutectic state and the first intermetallic compound is composed of nickel and tin, the melting temperature of the metallic braze material shifts towards gold and it becomes possible to raise the melting temperature of the metallic braze material comprising the gold-tin alloys.

Effects of the Invention

The piezoelectric resonator device according to the present invention, along with preventing damage to the main body casing of the piezoelectric resonator device during fabrication of the piezoelectric resonator device, permits adaptation to miniaturization of the main body casing.

BRIEF DESCRIPTION OF DRAWINGS

FIG. 3 is a diagram of data related to the yield of crystal resonators at a nickel-to-cobalt ratio of 3:1 and the yield of crystal resonators at a ratio of 6:1 according to Exemplary Embodiment 1.

DESCRIPTION OF REFERENCE NUMERALS

Figure 1:
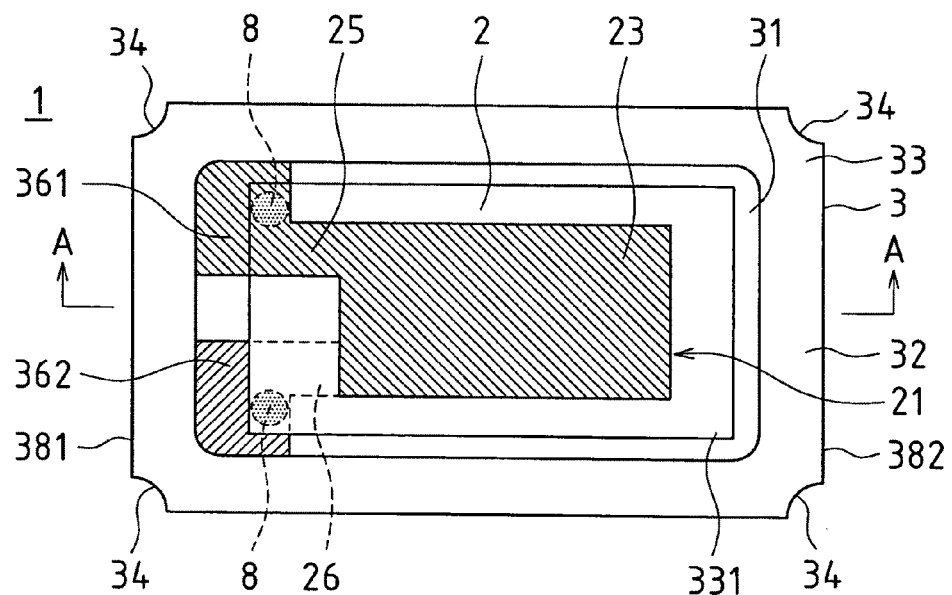
FIG. 1 is a schematic plan view of a base holding a crystal resonator element in a cantilevered manner in Exemplary Embodiments 1 and 2.

1 Crystal resonator (piezoelectric resonator device)
2 Crystal resonator element (piezoelectric resonator element)
3 Base
33 Bonding region
332 Metallization layer
333 Nickel-cobalt layer
334 Metal layer
4 Lid
5 Main body casing
7 Metallic braze material
91 Non-eutectic constituent part
92 First intermetallic compound
93 Nickel-cobalt layer
94 Second intermetallic compound
95 Third intermetallic compound

BEST MODE FOR CARRYING OUT THE INVENTION

Embodiments of the present invention are explained below with reference to drawings. It should be noted that the exemplary embodiments shown below show cases, in which the present invention is applied to an AT-cut crystal resonator as a piezoelectric resonator device.

Exemplary Embodiment 1

Figure 2:
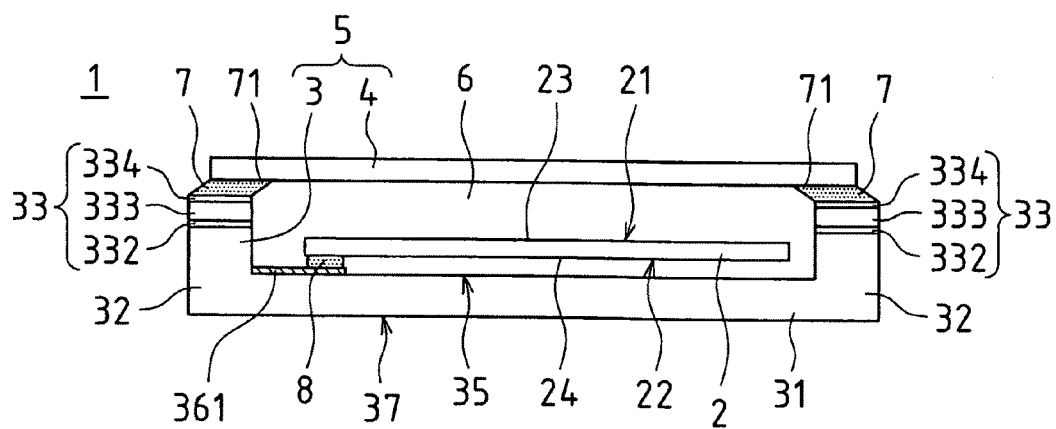
FIG. 2, which is a schematic structure chart of a crystal resonator according to Exemplary Embodiments 1 and 2, shows a schematic cross-sectional view taken along line A-A of FIG. 1.

As shown in FIGS. 1 and 2, the AT-cut crystal resonator 1 (hereinafter referred to as "crystal resonator") according to the present exemplary embodiment comprises an AT-cut crystal resonator element 2 (i.e. the "piezoelectric resonator element" of the present invention, hereinafter referred to as "crystal resonator element") formed to be rectangular in plan view, a base 3 holding the crystal resonator element 2, and a lid 4 used to hermetically seal the crystal resonator element 2 held on the base 3.

As shown in FIG. 2, in the crystal resonator 1, the base 3 and lid 4 are bonded by heat-melting using a metallic braze material 7, which is described below, thereby creating a main body casing 5, with an interior space 6 formed inside the main body casing 5. The crystal resonator element 2 is held on the base 3 of the interior space 6, with the interior space 6 of the main body casing 5 hermetically sealed. It should be noted that, in the interior space 6, the base 3 and crystal resonator element 2 are bonded by an FCB technique with the help of an electrically conductive bump 8, which is described below.

The configuration of the crystal resonator 1 is explained next.

As shown in FIGS. 1 and 2, the base 3 is shaped as a box-like body composed of a bottom portion 31 made up of ceramic material shaped as a single plate that is rectangular in plan view and dike portions 32 of ceramic material laminated onto the bottom portion 31, with the bottom portion 31 and dike portions 32 integrally sintered into a concave cross-sectional shape. Moreover, the dike portions 32 are molded around the periphery of the top face of the bottom portion 31. The top faces (edge faces) of the dike portions 32 constitute a region of bonding 33 to the lid 4. This bonding region 33 is composed of a metallization layer 332 made up of a metallization material, such as tungsten or molybdenum, a nickel-cobalt layer 333 made up of nickel and cobalt laminated on the metallization layer 332, and a metal layer 334 (gold-plated in the present exemplary embodiment) made up of gold, laminated on the nickel-cobalt layer 333. It should be added that these metallization layers 332 are formed by integrally sintering them to the base 3 of the box-like body, with a nickel-cobalt layer 333 and then a metal layer (gold layer) 334 formed by electroplating on the metallization layer 322. Moreover, castellations 34 are formed in the four corners along the periphery of the base 3 as seen in plan view. Additionally, electrode pads 361, 362, which are electrically connected to excitation electrodes 23, 24 (see below) on the crystal resonator element 2, are formed on the surface 35 of the base 3. These electrode pads 361, 362 are electrically connected to terminal electrodes (not shown) formed on the back side 37 of the base 3 via the respective corresponding connection electrodes (not shown) and the castellations 34. Connection to external components and external devices is made through these terminal electrodes. It should be noted that these electrode pads 361, 362, terminal electrodes, and connection electrodes are formed by printing using a metallization material such as tungsten, molybdenum, etc. and then integrally sintering them to the base. Also, in some of these electrode pads 361, 362, terminal electrodes, and connection electrodes (for instance, the portion formed to be exposed on the base 3), nickel-cobalt plating is formed on top of the metallization and gold plating on top of it.

In addition, as shown in FIG. 2, the metallic braze material 7 is used for the bonding of the lid 4 to the bonding region 33 of the base 3. In the present exemplary embodiment, an alloy material comprising gold and tin is used as the metallic braze material 7. Moreover, the entire bonding region 33 of the base 3 has (is wetted with) a nearly uniform amount of metallic braze material 7 formed over it. Moreover, as shown in FIG. 2, parts 71 of this metallic braze material 7 form an inner meniscus and are disposed within the interior space 6 formed by the base 3 and lid 4. Here, the phrase "parts 71 of this metallic braze material 7 . . . are disposed within the interior space 6" means that not only do parts 71 of the metallic braze material 7 face into the interior space 6, but these parts 71 of the metallic braze material 7 protrude into the interior space 6, with the parts 71 of the metallic braze material 7 being in a state, wherein they form overhangs in the direction of the interior space 6 from the dike portions 32 of the base 3. Specifically, as shown in FIG. 2, the parts 71 of the metallic braze material 7 form overhangs in the direction of the interior space 6 from the entire surface of the dike portions 32 of the base 3.

As shown in FIG. 2, the lid 4 is made up of ceramic material and is shaped as a single plate that is rectangular in plan view. Furthermore, the outside dimensions of the lid in plan view are designed to be somewhat smaller (proportionately smaller) than the outside dimensions of the base 3 as viewed in the same direction.

As shown in FIGS. 1 and 2, the crystal resonator element 2 is made up of an AT-cut crystal plate (not shown) and is shaped as a single cuboid plate that is rectangular in plan view. Excitation electrodes 23, 24, and lead-out electrodes 25, 26 drawn from the excitation electrodes 23, 24 in order to electrically connect these excitation electrodes 23, 24 to external electrodes (the electrode pads 361, 362 of the base 3 in the present exemplary embodiment) are formed respectively on the two major surfaces 21, 22 of this crystal resonator element 2. These excitation electrodes 23, 24 and lead-out electrodes 25, 26 are formed, for example, by laminating, starting from the crystal vibrating plate side, layers of chromium and gold, or chromium, gold, and chromium, or chromium, silver, and chromium. The lead-out electrodes 25, 26 of the crystal resonator element 2 and the electrode pads 361, 362 of the base 3 are then joined together using a piezoelectric resonator element-bonding member (see "electrically conductive bump 8" described below), with the crystal resonator element 2 held on the base 3 in a cantilevered manner as shown in FIGS. 1 and 2.

The electrically conductive bump 8 is used as a piezoelectric resonator element-bonding member used for mounting the crystal resonator element 2 by bonding it to the base 3.

As described above, in the crystal resonator 1 according to the present exemplary embodiment, the region of bonding 33 of the base 3 to the lid 4 is composed of at least the nickel-cobalt layer 333 and metal layer 334, with the base 3 and lid 4 bonded by heat melting using the metallic braze material 7, which prevents damage to the main body casing 5 of the crystal resonator 1 during fabrication of the crystal resonator 1 while permitting adaptation to miniaturization of the main body casing 5. In other words, failures due to the use of direct seam bonding, i.e. continuous local bonding, for the bonding of the base 3 to the lid 4 do not occur in the present exemplary embodiment as a result of using heat/melt bonding for the bonding of the case 3 to the lid 4. Specifically, unlike in direct seam bonding, the bonding of the base 3 to the lid 4 in the present exemplary embodiment consists in simultaneous full-surface bonding and, as a result, application of local pressure to the bonding area of the base 3 during the bonding of the base 3 to the lid 4 can be avoided. Moreover, in case of heat/melt bonding, the members of the apparatus do not come into contact with the base 3 and lid 4 during the bonding of the base 3 to the lid 4 and the adverse effects of the contact (cracking etc. of the base 3 and lid 4) on the miniaturization of the main body casing 5 can be avoided. Furthermore, since a nickel-cobalt layer 333 is included in the configuration in the present exemplary embodiment, the nickel of the nickel-cobalt layer 333 undergoes diffusion during the bonding of the base 3 to the lid 4 by heat/melt bonding, but the diffusion of the nickel can be minimized by the cobalt. Thus, according to the present exemplary embodiment, the diffusion of nickel into the metal layer 334 can be appropriately minimized, which makes it possible to improve the bonding of the base 3 to the lid 4 without decreasing the wettability of the metallic braze material 7.

It should be noted that, no failures (interference with the weld portion and other problems) associated with direct seam welding, which has been mentioned as conventional technology, occur during the heat/melt bonding using the gold-tin or other metallic braze materials 7 as shown in the present exemplary embodiment.

Incidentally, as described in the present exemplary embodiment, no pressure is applied during the heat/melt bonding between the base 3 and lid 4 for the purpose of bonding, as in direct seam welding (and even when it is applied, the pressure is not as high as in seam welding), as a result of which the bonding strength varies depending on the condition of the two bonding surfaces of the base 3 and lid 4. The wettability of the metallic braze material 7 varies depending on the condition of the two bonding surfaces of the base 3 and lid 4, and this variation in wettability affects the bonding strength. According to the present exemplary embodiment, however, adverse effects on the bonding strength can be kept to a minimum because the region of bonding 33 of the base 3 to the lid 4 is composed of at least the nickel-cobalt layer 333 and the metal layer 334, with the base 3 and lid 4 bonded by heat-melting using the metallic braze material 7.

Moreover, in the above-described crystal resonator 1, the heat/melt bonding is used for the bonding of the base 3 and lid 4 during fabrication of the crystal resonator 1, with said heat/melt bonding carried out at a heating temperature of not more than 360° C. To explain the preceding in greater detail, the heating temperature is preferably set to 280° C.-360° C., i.e. at the melting temperature of the gold-tin metallic braze material 7, which is a eutectic alloy, with 300° C. or so being desirable.

Because in this case the heating temperature does not exceed 360° C., nickel diffusion in the nickel-cobalt layer 333 can be minimized. Specifically, when the heating temperature is 500° C., the nickel of the nickel-cobalt layer 333 diffuses all the way to the surface of the metal layer 334, thereby adversely affecting the bonding of the base 3 and lid 4. The "adverse effects", as referred to herein, are the reason why hermeticity failures in the main body casing 5 occur; specifically, the nickel forms compounds with the tin of the metallic braze material 7 on the surface of the base 3 and the composition of the metallic braze material 7 undergoes changes due to their formation, as a result of which the wettability of the metallic braze material 7 decreases and hermeticity failures occur in the main body casing 5. Incidentally, when the heating temperature is 400° C., the wettability of the metallic braze material 7 deteriorates. Specifically, when the heating temperature is as high as 400° C., nickel diffusion in the nickel-cobalt layer 333 is enhanced and it is revealed on the bonding surface, causing the wettability (flowability) of the metallic braze material 7 on the bonding surface (bonding region on the surface of the base 3) to deteriorate. As a result, hermeticity failures occur in the main body casing 5. This is a problem inherent in the present exemplary embodiment, i.e. bonding by heat melting, which does not occur in direct seam bonding, i.e. continuous local bonding.

Moreover, in the above-described crystal resonator 1, the ratio of nickel to cobalt in the nickel-cobalt layer 333 is set to 1:1-3:1. Using such a ratio improves the wettability of the metallic braze material 7 and, as a result, prevents hermeticity failures in the main body casing. In particular, in comparison with cases, in which the ratio of nickel to cobalt in the nickel-cobalt layer 333 is set to 5:1-6:1, this is preferable in terms of the hermeticity of the main body casing 5, for which by the wettability of the metallic braze material 7 is responsible. Specifically, data on the yield of crystal resonators at a nickel-to-cobalt ratio of 3:1 and on the yield of crystal resonators at a ratio of 6:1 are shown in FIG. 3.

Moreover, in the above-described crystal resonator 1, the thickness of the metal layer 334 is set to 0.3 μm-1.0 μm. In particular, the thickness of the metal layer 334 is preferably set to a value in the vicinity of 0.3 μm, such as, for instance, 0.43 μm or so. In this case, it becomes possible to achieve miniaturization of the main body casing 5 along with minimizing the adverse effects on the bonding of the base 3 and lid 4 (see above) produced when the nickel diffused in the nickel-cobalt layer 333 appears on the surface the metal layer 334. Specifically, when the thickness of the metal layer 334 is set, for instance, to 0.43 µm, the present exemplary embodiment fares better in environmental tests (hermeticity of the main body casing 5, etc.) than the seam bonding described in the conventional example. Moreover, if the thickness of the metal layer 334 is less than 0.3 µm, the ratio of the nickel appearing on the surface of the metal layer 334 as a result of heating etc. increases and, during hermetic sealing, hermetic sealing performance deteriorates due to the decrease in the wettability of the metallic braze material 7. Furthermore, if the thickness of the metal layer 334 exceeds 1.0 µm, this is not desirable in practical use because the deposition of the nickel in the electrode pads 361, 362 portion is reduced to a minimum and, as a result, the characteristics of the electrically conductive bonding afforded by the resin-based electrically conductive bonding member deteriorate. It should be noted that while the electrode pads 361, 362 are formed on the base 3 and the electrode pads 361, 362 may utilize a multi-layer metal layer configuration comprising the metallization layer 332, the nickel-cobalt layer 333, and the metal layer 334 of gold etc., it is preferable for an appropriate amount of nickel to appear on the surface of the metal layer 334 when the crystal resonator element 2 is bonded to such electrode pads 361, 362 with the help of, for instance, silicone-, urethane- or other resin-based electrically conductive bonding members. This nickel can help improve bonding to the resin-based electrically conductive bonding member.

It should be noted that while the present exemplary embodiment utilizes an AT-cut crystal resonator element 2 as the piezoelectric resonator element, the invention is not limited thereto and the element may be a tuning fork-type crystal resonator element.

Moreover, while the present exemplary embodiment utilizes gold plating for the metal layer 334, this is merely a preferred example to which the invention is not limited, and other metallic materials in other forms may be used so long as this is advantageous in terms of bonding to the metallic braze material.

Moreover, while the present exemplary embodiment utilizes an electrically conductive bump 8 as the piezoelectric resonator element-bonding member, this is a preferred example adapted to miniaturization of the main body casing 5, to which the invention is not limited, and electrically conductive adhesive agents made of silicone resins, etc. may be used as well.

Furthermore, the present invention can also be applied to a crystal oscillator integrally containing crystal resonator elements, ICs, etc.

Figure 4:
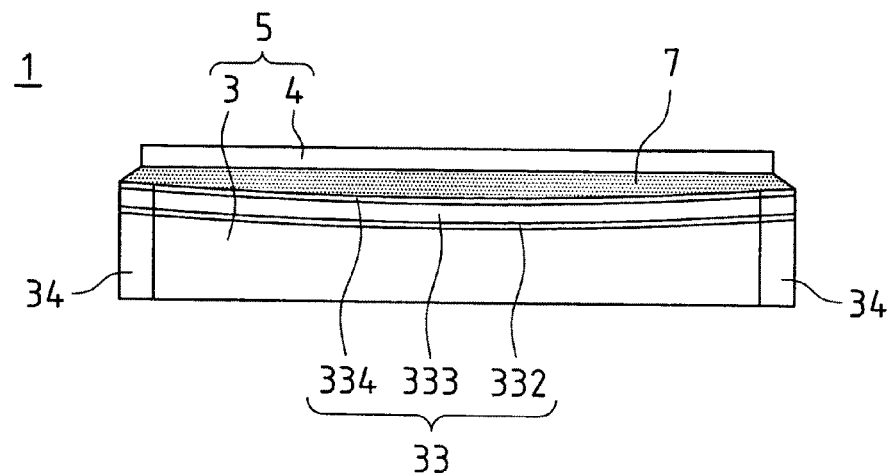
FIG. 4 is a schematic side view of a crystal resonator in another example of Exemplary Embodiment 1.

Moreover, despite the fact that the present exemplary embodiment describes an example, in which the dike portions 32 of the base 3 are flush therewith, the invention is not limited thereto, and the shape of the base 3 may be slightly changed depending on various conditions in the process of fabrication. For instance, as shown in FIG. 4, the dike portions 32 corresponding to the edges of the base 3 in the longitudinal direction may be shaped so as to be curved in the direction of the bottom portion. In this case, too, using the above-described exemplary embodiment enables the metallic braze material 7 to be formed over the entire surface of the bonding region 33 formed on the dike portions 32 of the base 3 (the entire surface can be wetted by the metallic braze material 7). This is related to the presence of nickel diffusion in the nickel-cobalt layer 333 and the wettability of the metallic braze material 7. In other words, because in the present exemplary embodiment the diffusion of the nickel to the metal layer 334 is appropriately suppressed, the wettability of the metallic braze material 7 is excellent and the metallic braze material 7 can be formed over the entire bonding region 33 of the base 3.

Moreover, while the present embodiment utilizes a metallic braze material made up of a eutectic alloy comprising gold and tin as the metallic braze material 7, the invention is not limited thereto and it is sufficient if it is a metallic braze material, which may be a eutectic alloy-based braze material, a braze material based on tin-silver-copper or bismuth (bismuth-silver) etc., or an alloy-based braze material made up of gold and tin with a higher ratio of tin. An exemplary embodiment using a braze material made up of an alloy comprising gold and tin that is a non-eutectic alloy with a slightly higher ratio of tin than in a gold-tin eutectic alloy, is described next.

Exemplary Embodiment 2

Figure 5:
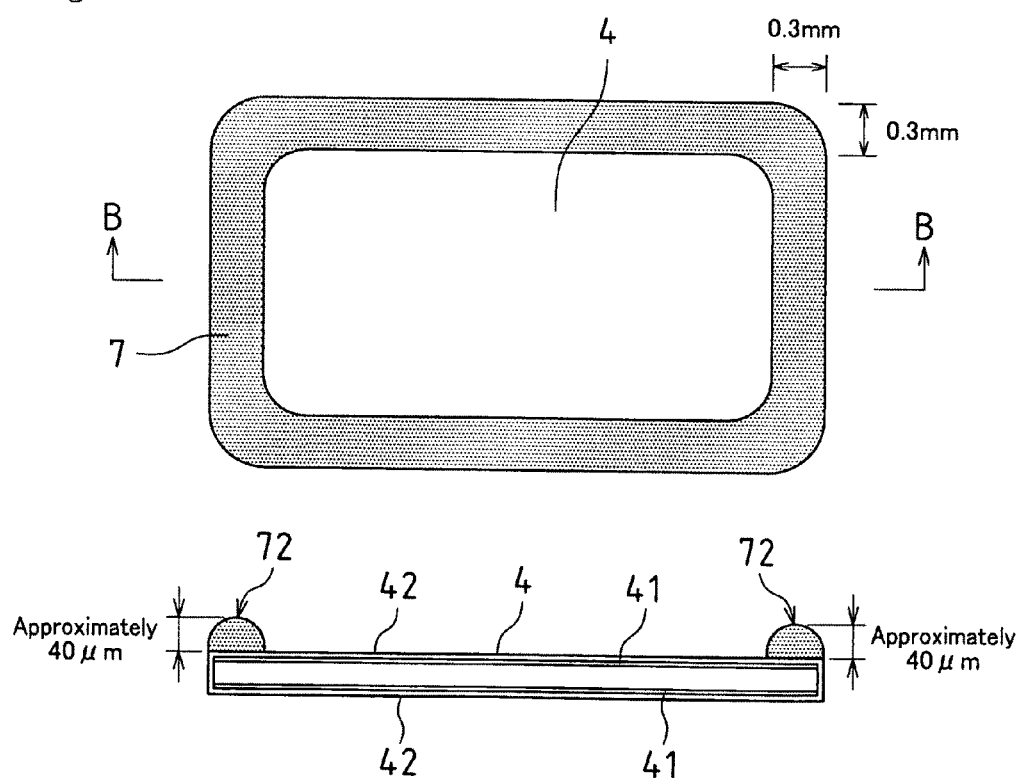
FIG. 5 is a schematic plan view of a lid according to Exemplary Embodiment 2, in which metallic braze material is formed on the surface used for bonding to a base.

A crystal resonator 1 according to Exemplary Embodiment 2 will be explained with reference to drawings. It should be noted that in the crystal resonator 1 according to Exemplary Embodiment 2 the configurations of the lid 4, the bonding region 33, and the metallic braze material 7 are different from the above-described Exemplary Embodiment 1. Thus, in the Exemplary Embodiment 2, explanations are provided with respect to configurations different from the above-described Exemplary Embodiment 1 and explanations related to similar configurations are omitted. For this reason, operation, effects, and alternate embodiments based on the same configuration have the same operation, effects, and alternate embodiments as the above-described Exemplary Embodiment 1. It should be noted that FIG. 1 shown in Exemplary Embodiment 2 is a schematic structure chart of the base 3 holding a crystal resonator element 2 in a cantilevered manner. Moreover, FIG. 2 is a schematic structure chart of the crystal resonator 1. FIG. 5 is a schematic structure chart of the lid 4, wherein metallic braze material 7 is formed on the surface used for bonding to the base 3.

As shown in FIGS. 1, 2, and 5, the crystal resonator 1 according to the present exemplary embodiment comprises a crystal resonator element 2, a base 3 holding the crystal resonator element 2, and a lid 4 used to hermetically seal the crystal resonator element 2 held on the base 3, and, as shown in FIGS. 2 and 5, metallic braze material 7 is used for the bonding of the lid 4 to the bonding region 33 of the base 3.

The lid 4 is made up of Kovar, which is a metallic material (an alloy comprising iron, nickel, and cobalt), and is shaped as a single plate that is rectangular in plan view. Moreover, as shown in FIG. 5, nickel plating 41 is formed on the two major surfaces (including the surface used for bonding to the base 3) of the plate-shaped Kovar and gold plating 42 is superimposed on top of the Kovar and nickel plating 41 so as to cover the Kovar and nickel plating 41. Then, prior to the bonding of the lid 4 to the base 3, metallic braze material 7 is formed, as shown in FIG. 5, along the periphery of the lid 4 as seen in plan view, i.e. the bonding surface of the lid 4 used for bonding to the base 3. It should be noted that the outside dimensions of the lid 4 in plan view are designed to be somewhat smaller (proportionately smaller) than the outside dimensions of the base 3 as viewed in the same direction.

The metallic braze material 7 formed on the lid 4 prior to bonding to the base 3 is a eutectic alloy (or an off-eutectic alloy) composed of gold and tin. As referred to herein, the term "off-eutectic alloy" designates an alloy formed based not on a 80:20 wt% ratio of gold to tin, i.e. not on the ratio of a eutectic alloy, but on a ratio close thereto, for example, an alloy, in which the wt% ratio of gold to tin is 78.5:21.5.

Moreover, as used herein, the expression "a ratio close thereto" designates ratios of from 80:20 (eutectic) to 78:22. Specifically, in the present exemplary embodiment, it is formed with wt% ratio of gold to tin of approximately 78.5:21.5 and, as shown in FIG. 5, such that it has dimensions with a width of not more than 0.3 mm (0.3 mm in the present exemplary embodiment) on the surface used for the bonding of the lid 4 to the base 3. And, as shown in FIG. 5, the metallic braze material 7 formed on the lid 4 prior to bonding to the base 3 is shaped so as to have a semicircular cross-section on top of the lid 4, with its height. set, for instance, to about 50 μm or less (about 40 μm in the present exemplary embodiment).

Then, the main body casing 5 is formed and the crystal resonator 1 illustrated in FIG. 2 is produced by bonding the lid 4 illustrated in FIG. 5 to the bonding region 33 of the base 3 illustrated in FIG. 1 by heat-melting using a metallic braze material 7 in a vacuum-heating oven (under a vacuum atmosphere), not shown. The metallic braze material 7 used at such time has the constitution described below. Also, the bonding conditions used in the present exemplary embodiment are as follows.

The temperature used for bonding the base 3 and lid 4 (sealing temperature) is set in the range of from 300° C. to 360° C. (desirably, 310° C. to 340° C.); in the present exemplary embodiment, it was set to 310° C. Moreover, the heating time, during which bonding is carried out, is set to within 5 minutes. If the heating time exceeds 5 minutes, the excessive application of heat to the metallic braze material 7 renders it brittle. It should be noted that while the bonding temperature (sealing temperature) used during bonding in the present exemplary embodiment is set to 310° C., in order to improve the efficiency of the bonding operation, the temperature may be raised in advance to a predetermined temperature lower than the bonding temperature (sealing temperature). Moreover, the bonding environment can be stabilized because the bonding of the lid 4 and base 3 is carried out under a vacuum atmosphere.

As a result of bonding the lid 4 to the base 3 by heat-melting, the metallic braze material 7 and the bonding region 33 on the base 3 are united, such that, after the lid 4 is bonded to the base 3 by heat-melting, a nearly uniform amount of the metallic braze material 7 is formed over the entire bonding region 33 of the base 3. Moreover, as shown in FIG. 2, parts 71 of the metallic braze material 7 produced when the lid 4 is bonded to the base 3 by heat-melting form an inner meniscus and are disposed within the interior space 6 formed by the base 3 and lid 4. Specifically, as shown in FIG. 2, said parts 71 of the metallic braze material 7 form overhangs in the direction of the interior space 6 from the entire area of the dike portions 32 of the base 3.

Figure 6:
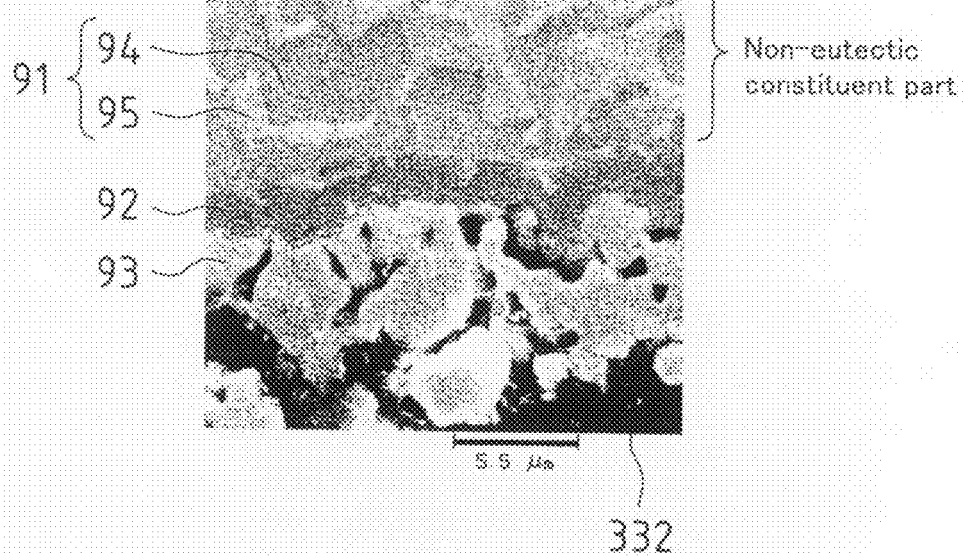
FIG. 6 is a schematic enlarged cross-sectional view of a bonding zone in the crystal resonator according to the present exemplary embodiment, which illustrates the bonding relationship of the metallic braze material and the bonding region of the base shown in FIG. 2.
Figure 7:
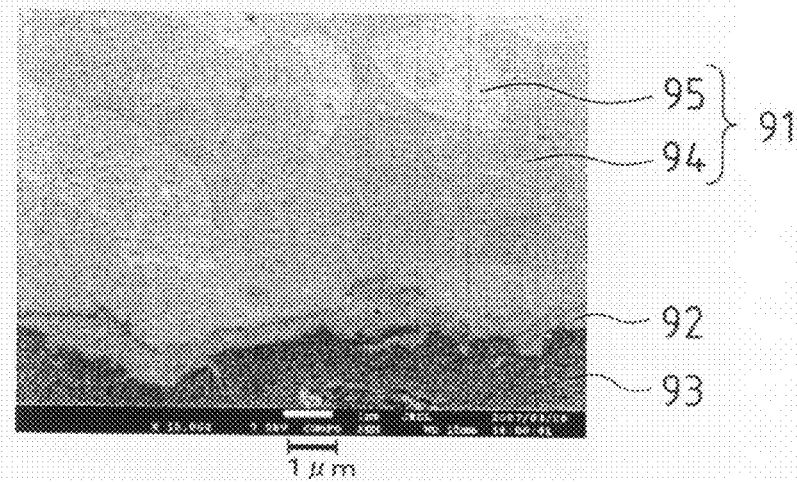
FIG. 7 is a schematic enlarged cross-sectional view produced by further enlarging the enlarged cross-sectional view shown in FIG. 6.

Moreover, as shown in FIGS. 6 and 7, as a result of the above-described union (bonding of the base 3 and lid 4) of the metallic braze material 7 and the bonding region 33 (metallization layer 332, nickel-cobalt layer 333, and metal layer 334), the metallic braze material 7 is converted into a non-eutectic alloy composed of a non-eutectic constituent part 91 and a first intermetallic compound 92. Moreover, the bonding region 33 is composed of the first intermetallic compound 92, a nickel-cobalt layer 93 comprising nickel and cobalt (depending on the conditions, a nickel layer 93), and a metallization layer 332. In other words, the metallic braze material 7 and bonding region 33 are composed of the non-eutectic constituent part 91, the first intermetallic compound 92, the nickel-cobalt layer 93, and the metallization layer 332, with the first intermetallic compound 92 shared jointly by the metallic braze material 7 and metal layer 334.

The non-eutectic constituent part 91 is composed of the second intermetallic compound 94 composed of gold and tin, which has a non-eutectic composition and in which the compositional ratio of gold is higher, and a third intermetallic compound 95 composed of gold and tin, in which the gold and tin are present in the composition in roughly the same compositional ratios. For instance, in the present exemplary embodiment, the second intermetallic compound 94 has a gold-rich constitution, such as $Au_6Sn$, etc., and the third intermetallic compound 95 has a constitution including compounds in which the ratio of gold and tin is 1:1 (roughly equal) ($AuSn$, $AuSn_2$, etc.). Moreover, the first intermetallic compound 92 is composed of nickel and tin. It should be noted that this "near-equality" of the gold-to-tin ratio of the third intermetallic compound 95 is not strictly limited to a ratio of 1:1.

With respect to the above-described metallic braze material 7, the bonding of the base 3 and lid 4 generates in the eutectic composition of the metallic braze material 7 formed on the lid 4 a non-eutectic constituent part 91 that is in a non-eutectic state and comprises a second intermetallic compound 94 along with a third intermetallic compound 95, with the interior space 6 inside the main body casing 5 hermetically sealed in this state.

Figure 8:
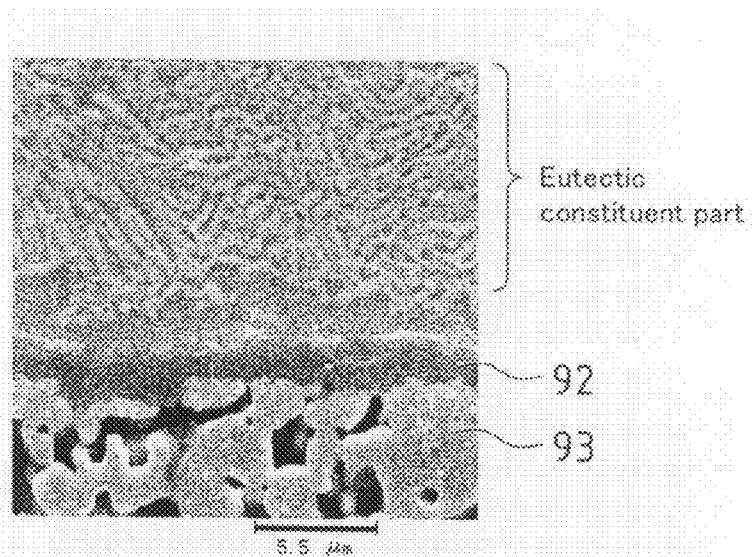
FIG. 8 is a schematic enlarged cross-sectional view of a bonding zone in a crystal resonator according to a comparative exemplary embodiment, illustrating the bonding relationship of the metallic braze material and the bonding region of the base.

It should be noted that the above-described FIGS. 6 and 7 illustrate an experimental embodiment, in which the metallic braze material 7 and the bonding region 33 are joined together. Moreover, an embodiment, in which the metallic braze material remains a eutectic alloy even after uniting the metallic braze material and the bonding region is shown in FIG. 8 as a comparative embodiment of the exemplary embodiments. FIG. 6 is a schematic enlarged cross-sectional view of a bonding zone illustrating the bonding relationship between the metallic braze material 7 and the bonding region 33 of the base 3 shown in FIG. 2, and FIG. 7 is a schematic enlarged cross-sectional view produced by further enlarging the enlarged cross-sectional view shown in FIG. 6. In addition, FIG. 8 is a schematic enlarged cross-sectional view of a bonding zone illustrating the bonding relationship of the metallic braze material and the bonding region of the base in a comparative embodiment. It should be noted that the portion shown in FIG. 8 that is joined in a form of a large number of layers is a eutectic constituent part.

As shown in FIGS. 6 and 7, according to the present exemplary embodiment, a configuration is used, in which the metallic braze material 7 absorbs the gold-containing metal layer 334 of the bonding region 33, and, in addition, due to the formation of the first intermetallic compound 92 comprising nickel and tin, the melting temperature of the metallic braze material 7 shifts towards gold and becomes higher. In fact, in the above-described experimental embodiment, rework was carried out (heating conditions during rework: conducted by repeating a heating period of 10 seconds three times at a heating temperature of 350° C.), but the metallic braze material 7 did not melt. It should be noted that when the heating period of 10 seconds was repeated three times at a heating temperature of 450° C. in the experimental example, the metallic braze material 7 did not melt even in that case.

As described above, in the crystal resonator 1 according to the present exemplary embodiment, the configuration of the lid 4, the bonding region 33, and the metallic braze material 7 is different, but other configurations are the same; accordingly, operation, effects, and alternate embodiments based on the same configuration have the same operation, effects, and alternate embodiments as the above-described Exemplary Embodiment 1.

Moreover, as described above, in the present exemplary embodiment, the metallic braze material 7 is composed of the non-eutectic constituent part 91 and the first intermetallic compound 92. In addition, the metallic braze material 7 and bonding region 33 are composed of at least the non-eutectic constituent part 91, the first intermetallic compound 92, and the nickel-cobalt layer 93. For this reasons, temperature conditions during rework can be satisfied by changing the melting temperature. Specifically, while there is a chance that the melting point of the metallic braze material might rise and cause re-melting, and, as a result, create an impediment to rework when rework is carried out under heating conditions in the vicinity of the temperature of heat-melting (e.g. 350° C.) if the metallic braze material bonding the lid 4 to the base 3 has a eutectic composition (see the comparative embodiment), the present exemplary embodiment (see the experimental embodiment) makes it possible to prevent the metallic braze material 7 from re-melting.

Moreover, the non-eutectic constituent part 91 comprises, in a non-eutectic state, the second intermetallic compound 94 and third intermetallic compound 95. Also, more specifically, the first intermetallic compound 92 is composed of nickel and tin. For this reason, the melting temperature of the metallic braze material 7 can be raised by shifting the melting temperature of the metallic braze material 7 towards gold.

Moreover, by setting the width of the metallic braze material 7 formed on the lid 4 prior to bonding to the base 3 to not more than 0.3 mm and setting the width of its protruding portion 72 to not more than 0.03 μm, the condition (state of wetting) of the metallic braze material 7 formed on the lid 4 can be optimized and a nearly uniform amount of metallic braze material 7 can be formed around the entire periphery of the lid 4 in plan view, as shown in FIG. 5.

Figure 9:
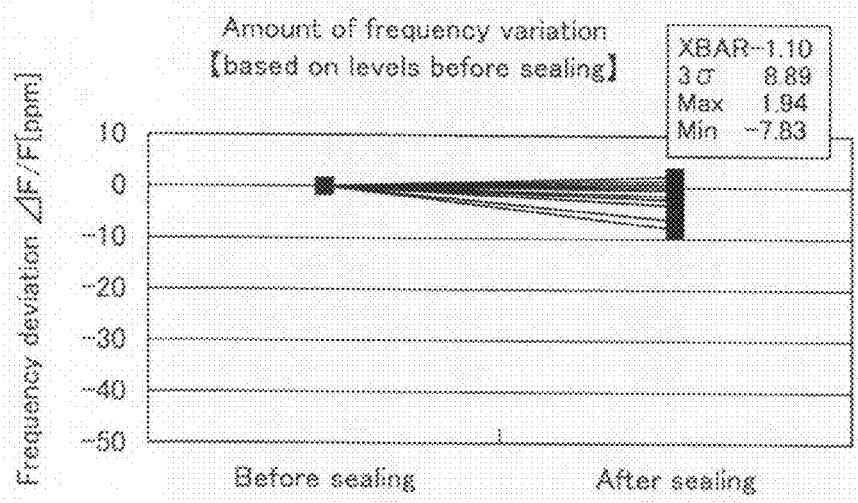
FIG. 9 is a graph illustrating variations in frequency before and after the sealing of the base by bonding using the lid according to Exemplary Embodiment 2.

Moreover, in some cases, there may be variations in frequency before and after the sealing of the base 3 by bonding using the lid 4. While it is suggested that these variations in frequency are caused by variations in the region where the metallic braze material 7 is formed on the lid 4 (wettability variations), in the present exemplary embodiment, the wt % ratio of gold to tin in the metallic braze material 7 formed on the lid 4 prior to bonding to the base 3 is set to about 78.5:21.5, the width of the metallic braze material 7 formed on the lid 4 prior to bonding to the base 3 is set to not more than 0.3 mm, and the width of its protruding portion 72 is set to not more than 0.03 μm, which makes it possible to impart the shape illustrated in FIG. 2 to the shape of the metallic braze material 7 on the lid 4 and to minimize frequency variations before and after the sealing of the base 3 by bonding using the lid 4. In fact, measurements were carried out to determine variations in frequency before and after sealing by bonding when the metallic braze material 7 was formed on the lid 4 using these settings. The results of the measurements are shown in FIG. 9. The data shown in FIG. 9 represent results obtained by conducting measurements on 10 crystal resonators 1 fabricated using the above-described settings.

Moreover, as described above, as a result of forming the metallic braze material 7 on the lid 4 illustrated in FIG. 5, the lid 4 can be subjected to quality evaluation before the lid 4 is bonded to the base 3 and only lids 4 that are determined to be of excellent quality can be bonded to the lid 3.

Moreover, because the present exemplary embodiment includes the nickel-cobalt layer 333 in the constitution of the bonding region 33, excessive diffusion of nickel to the surface of the bonding region 33 during the bonding of the lid 4 to the base 3 can be minimized by the cobalt and the union of the nickel with the tin of the metallic braze material 7 can be suppressed. As a result, difficulties in the melting of the metallic braze material 7 caused by the union of the nickel with the tin (wettability deterioration) can be minimized.

It should be noted that despite the use of Kovar in the lid 4 in the present exemplary embodiment, this is a preferred embodiment, to which the invention is not limited, and other metallic materials, such as Alloy No. 42, etc., may be used as well.

Moreover, despite the fact that a eutectic alloy comprising gold and tin is suggested as the metallic braze material 7 formed on the lid 4 prior to bonding to the base 3 in the present exemplary embodiment, this is a preferred embodiment, to which the invention is not limited, and, for instance, eutectic alloys comprising silver and tin or eutectic alloys comprising copper and tin may be used as well.

Moreover, despite the use of a metallic material for the lid 4 in the present exemplary embodiment, this is a preferred embodiment, to which the invention is not limited, and the ceramic material of the above-described Exemplary Embodiment 1 may be used for the lid 4 as well. It should be noted that when the ceramic material of the above-described Exemplary Embodiment 1 is used for the lid 4, it is possible to form the metallic braze material 7 directly on the ceramic, or carry out metallization treatment and then form nickel plating 41 and gold plating 42.

It should be noted that the present invention can be implemented in a variety of other forms without departing from its spirit, gist or main features. For this reason, the above-described embodiments are to all intents and purposes merely illustrative and should not be construed as limiting. The scope of the present invention is indicated by the claims and is not in any way restricted by the text of the Detailed Description. Furthermore, all variations and modifications of the claims within the scope of equivalency fall within the purview of the present invention.

In addition, this Application claims priority rights from Japanese Patent Application No. 2006-218118 filed on Aug. 10, 2006 in Japan. Its entire contents are incorporated in this Application by reference.

INDUSTRIAL APPLICABILITY

The present invention can be applied to piezoelectric resonator devices and is particularly suited to crystal resonators.

The invention claimed is:

1. A piezoelectric resonator device including a base holding a piezoelectric resonator element and a lid bonded to the base in order to hermetically seal the piezoelectric resonator element held on the base,
   wherein a region of bonding of the base to the lid is composed of at least a nickel-cobalt layer made up of nickel and cobalt and a metal layer made up of metallic material laminated on the nickel-cobalt layer, and
   the base and the lid are bonded by heat-melting using a metallic braze material.

2. The piezoelectric resonator device according to claim 1, wherein the heat/melt bonding is carried out at a heating temperature of not more than 360° C.

3. The piezoelectric resonator device according to claim 1, wherein the ratio of nickel to cobalt in the nickel-cobalt layer is 1:1 to 3:1.

4. The piezoelectric resonator device according to claim 1, wherein the thickness of the metal layer is 0.3 to 1.0 μm.

5. The piezoelectric resonator device according to claim 1, wherein the metallic braze material is composed of a non-eutectic constituent part and a first intermetallic compound.

6. The piezoelectric resonator device according to claim 5, wherein the non-eutectic constituent part comprises, in a non-eutectic state, a second intermetallic compound composed of gold and tin, in which the compositional ratio of gold is higher, and a third intermetallic compound composed of gold and tin, in which the gold and tin are present in the composition in roughly the same compositional ratios.

7. The piezoelectric resonator device according to claim 1, wherein the metallic braze material and the bonding region are composed of at least a non-eutectic constituent part, a first intermetallic compound, and a nickel-cobalt layer comprising nickel and cobalt.

8. The piezoelectric resonator device according to claim 7, wherein the non-eutectic constituent part comprises, in a non-eutectic state, a second intermetallic compound composed of gold and tin, in which the compositional ratio of gold is higher, and a third intermetallic compound containing a compound composed of gold and tin, in which the gold and tin are roughly equal, and the first intermetallic compound is composed of nickel and tin.

9. The piezoelectric resonator device according to claim 2, wherein the ratio of nickel to cobalt in the nickel-cobalt layer is 1:1 to 3:1.

10. The piezoelectric resonator device according to claim 2, wherein the thickness of the metal layer is 0.3 to 1.0 μm.

11. The piezoelectric resonator device according to claim 3, wherein the thickness of the metal layer is 0.3 to 1.0 μm.

12. The piezoelectric resonator device according to claim 2, wherein the metallic braze material is composed of a non-eutectic constituent part and a first intermetallic compound.

13. The piezoelectric resonator device according to claim 3, wherein the metallic braze material is composed of a non-eutectic constituent part and a first intermetallic compound.

14. The piezoelectric resonator device according to claim 4, wherein the metallic braze material is composed of a non-eutectic constituent part and a first intermetallic compound.

15. The piezoelectric resonator device according to claim 2, wherein the metallic braze material and the bonding region are composed of at least a non-eutectic constituent part, a first intermetallic compound, and a nickel-cobalt layer comprising nickel and cobalt.

16. The piezoelectric resonator device according to claim 3, wherein the metallic braze material and the bonding region are composed of at least a non-eutectic constituent part, a first intermetallic compound, and a nickel-cobalt layer comprising nickel and cobalt.

17. The piezoelectric resonator device according to claim 4, wherein the metallic braze material and the bonding region are composed of at least a non-eutectic constituent part, a first intermetallic compound, and a nickel-cobalt layer comprising nickel and cobalt.

18. The piezoelectric resonator device according to claim 9, wherein the thickness of the metal layer is 0.3 to 1.0 μm.

19. The piezoelectric resonator device according to claim 9, wherein the metallic braze material and the bonding region are composed of at least a non-eutectic constituent part, a first intermetallic compound, and a nickel-cobalt layer comprising nickel and cobalt.

20. The piezoelectric resonator device according to claim 10, wherein the metallic braze material and the bonding region are composed of at least a non-eutectic constituent part, a first intermetallic compound, and a nickel-cobalt layer comprising nickel and cobalt.

* * * * *